United States Patent [19]

Katou et al.

[11] Patent Number: 5,589,319
[45] Date of Patent: Dec. 31, 1996

[54] PHOTOSENSITIVE POLYIMIDE RESIN COMPOSITION

[75] Inventors: Kouichi Katou; Eiji Watanabe, both of Kanagawa; Kouichi Kunimune, Chiba, all of Japan

[73] Assignee: Chisso Corporation, Osaka, Japan

[21] Appl. No.: 196,125

[22] PCT Filed: Jun. 24, 1993

[86] PCT No.: PCT/JP93/00853

§ 371 Date: Feb. 17, 1994

§ 102(e) Date: Feb. 17, 1994

[87] PCT Pub. No.: WO94/00800

PCT Pub. Date: Jan. 6, 1994

[30] Foreign Application Priority Data

Jun. 25, 1992 [JP] Japan .................................. 4-190155

[51] Int. Cl.$^6$ .................................................. G03C 1/73
[52] U.S. Cl. ........................... 430/288.1; 430/286.1; 430/281.1; 430/287.1; 430/906; 522/137; 522/138; 522/142
[58] Field of Search ............................. 430/288, 286, 430/281, 287, 906; 522/137, 138, 142

[56] References Cited

U.S. PATENT DOCUMENTS

| | | | |
|---|---|---|---|
| 4,416,973 | 11/1983 | Goff | 430/281 |
| 4,430,418 | 2/1984 | Goff | 430/288 |
| 4,515,887 | 5/1985 | Davis | 430/283 |
| 4,604,230 | 8/1986 | Goswami et al. | 523/400 |
| 4,692,272 | 9/1987 | Goswami et al. | 523/400 |
| 4,927,431 | 5/1990 | Buchanan et al. | 427/44 |
| 5,149,776 | 9/1992 | Kushi et al. | 430/288 |
| 5,236,472 | 8/1993 | Kirk et al. | 51/298 |
| 5,342,739 | 8/1994 | Katou et al. | 430/325 |

FOREIGN PATENT DOCUMENTS

| | | |
|---|---|---|
| 0453237 | 10/1991 | European Pat. Off. . |
| 54-145794 | 11/1974 | Japan . |
| 55-45746 | 3/1980 | Japan . |
| 55-41422 | 10/1980 | Japan . |
| 59-15449 | 1/1984 | Japan . |
| 60-6729 | 1/1985 | Japan . |
| 63-183439 | 7/1988 | Japan . |
| 63-206740 | 8/1988 | Japan . |
| 63-226639 | 9/1988 | Japan . |
| 2144539 | 6/1990 | Japan . |
| 391752 | 4/1991 | Japan . |
| WO92/15045 | 9/1992 | WIPO . |

OTHER PUBLICATIONS

Database Chemical Abstract No. 114:72358, Columbus, OH & JP A 02 154 260, Hitachi Chem. Co., Ltd., Jun. 13, 1990.

*Primary Examiner*—George F. Lesmes
*Assistant Examiner*—Laura Weiner
*Attorney, Agent, or Firm*—Leydig, Voit & Mayer

[57] ABSTRACT

The present invention provides a photosensitive resin composition into which a photosensitive group can be easily given and introduced and which is excellent in conservation, stability, heat resistance, practical physical properties and sensitivity and which can inhibit cracks from occurring at the time of development.

The photosensitive resin composition of the present invention comprises 100 parts by weight of a polyimide, 10–100 parts by weight of an isocyanurate having a (meth)acrylic group, 10–100 parts by weight of a polyalkylene glycol di(meth)acrylate, and 0.5–20 parts by weight of a photopolymerization initiator. This composition can be utilized to obtain a patterned polyimide film having heat resistance.

This composition can be applied to uses of electronic materials such as interlayer films of multi-layer boards of printed-wiring boards, and the like.

16 Claims, No Drawings

PHOTOSENSITIVE POLYIMIDE RESIN COMPOSITION

DESCRIPTION

1. Technical Field

The present invention relates to a photosensitive resin composition. More specifically, it relates to a highly photosensitive and easily manufacturable resin composition suitable for the manufacture of thick films.

2. Background Art

As heat-resistant photosensitive materials, photosensitive polyimides are widely used to form insulating films and passivation films for semiconductors. Most of the photosensitive materials are polyimides or their precursors into which photosensitive groups are introduced, and mixtures of polyimide precursors and compounds having photosensitive groups. As examples of the former, Japanese Patent Publication No. (Sho)55-41422 discloses an ester of polyamic acid in which a photosensitive group is bonded to a side chain, and Japanese Patent Application Laid-open No. (Sho)60-6029 discloses a method for synthesizing a photosensitive polyimide by the use of a previously synthesized diamine having a double bond. However, in these methods, a process of introducing the photosensitive group is unpreferably complex.

Furthermore, Japanese Patent Application Laid-open Nos. (Sho)55-45746 and (Sho)60-100143 discloses a method in which an unsaturated epoxy compound or an unsaturated isocyanate compound is reacted with a carboxyl group of each polyamic acid, but this method has the drawback that on reacting an epoxy group or an isocyanate group with the carboxyl group of the polyamic acid, a part of the polyamic acid is decomposed, so that the viscosity of a solution decreases. As the mixtures of the polyimide precursor of the polyamic acid and the compounds having the photosensitive group of the latter, compositions prepared by mixing the polyamic acid and compounds having a photoreactive unsaturated group are disclosed in, for example, Japanese Patent Application Laid-open Nos. (Sho) 63-206740, (Sho)59-15449 and (Hei)2-144539. However, in Japanese Patent Laid-open No. (Sho)63-206740, a peroxide is used as an initiator, and hence shelf stability is poor. In Japanese Patent Application Laid-open Nos. (Sho)59-15449 and (Hei)2-144539, the polyamic acids having specific structures are used, and hence practical physical properties such as heat resistance and mechanical strength unpreferably decline.

On the other hand, Japanese Patent Laid-open No. (Sho)54-145794 discloses a method which comprises mixing a compound containing a double bond and an amino group or its quaternary salt with the polyamic acid. The composition obtained by this mixing method has good compatibility but low sensitivity, and it has the problem that cracks tend to occur at the time of development. In Japanese Patent Application Laid-open No. (Hei)3-91752, it is described to use a specific polyfunctional amino acrylate. In this technique, problems such as the sensitivity and the crack formation at the development can be solved, but this polyfunctional amino acrylate is less available as a commercial product.

DISCLOSURE OF THE INVENTION

SUMMARY OF THE INVENTION

An object of the present invention is to provide a highly photosensitive and easily manufacturable resin composition suitable for the manufacture of thick films having a practically sufficient sensitivity, and according to this resin composition, the above-mentioned drawbacks of conventional photosensitive materials can be overcome.

The present inventors have conducted various investigations, and as a result, they have found that a photosensitive resin composition suitable for thick films can be easily obtained by using an isocyanurate having a specific (meth-)acrylic group and a polyalkylene glycol di(meth)acrylate in a specific ratio. In consequence, the present invention has been completed.

That is, a photosensitive resin composition of the present invention is characterized by comprising (1) 100 parts by weight of a polyimide, (2) 10–100 parts by weight of an isocyanurate having a (meth)acrylic group, (3) 10–100 parts by weight of a polyalkylene glycol di(meth)acrylate, and (4) 0.5–20 parts by weight of a photopolymerization initiator.

In this case, it is particularly preferred that the polyimide is a compound having a fluorine atom or a sulfone group.

DETAILED DESCRIPTION OF THE INVENTION

A polyimide in a composition of the present invention can be easily prepared from a polyamic acid obtained, by a known process, for example, by reacting a tetracarboxylic dianhydride with a diamine in a solvent. Both the tetracarboxylic dianhydride and the diamine are preferably aromatic compounds, but alicyclic compounds, aliphatic compounds or siloxane compounds are also acceptable. However, for a formation of the thick film, a compound containing a fluorine atom or a sulfone group is particularly preferable, because of being excellent in solubility and transparency.

Typical examples of the tetracarboxylic dianhydride include the following known compounds, but the invention should not be construed as being limited to these compounds.

Aromatic tetracarboxylic acid dianhydrides such as 2,2-bis-(3,4-dicarboxyphenyl)hexafluoropropane dianhydride, bis-(3,4-dicarboxyphenyl)sulfone dianhydride, bis-(3,4-dicarboxyphenyl) ether dianhydride, 3,3',4,4'-benzophenonetetracarboxylic acid dianhydride, 2,2',3,3'-benzophenonetetracarboxylic acid dianhydride, 2,3,3',4'-benzophenonetetracarboxylic dianhydride, 3,3',4,4'-biphenyltetracarboxylic dianhydride 2,2',3,3'-biphenyltetracarboxylic dianhydride, 2,3,3',4'-biphenyltetracarboxylic dianhydride, pyromellitic dianhydride, 1,2,5,6-naphthalenetetracarboxylic dianhydride, 2,3,6,7-naphthalenetetracarboxylic dianhydride and the like; alicyclic tetracarboxylic dianhydrides such as cyclobutanetetracarboxylic dianhydride, methylcyclobutanetetracarboxylic dianhydride and the like; and an aliphatic tetracarboxylic dianhydride such as 1,2,3,4-butanetetracarboxylic dianhydride and the like.

Furthermore, typical examples of the diamine include the following compounds, but the invention should not be construed as being limited to these compounds.

Aromatic diamines such as 4,4'-diaminodiphenyl ether, 3,4'-diaminodiphenyl ether, 3,3'-diaminodiphenyl sulfone, 4,4'-diaminodiphenylmethane, 4,4'-diaminodiphenyl sulfone, 4,4'-diaminodiphenyl sulfide, 4,4'-di(m-aminophenoxy)diphenyl sulfone, 4,4'-di(p-aminophenoxy)diphenyl sulfone, orthophenylenediamine, methaphenylenediamine, p-phenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminanphthalene, 4,4'-bis(4-aminophenoxy)biphenyl, 2,2-bis{4-(4- aminophenoxy)phenyl}hexafluoropropane, 1,4-bis(4-aminophenoxy)benzene, 1,3-bis(4-aminophenoxy)benzene, 4,4'-diamino-3,3'-diethyl-5,5'-dimethyldiphenylmethane, 4,4'-diamino-3,3',5,5'-tetramethyldiphenylmethane, 1,4-diaminotoluene, methaxylylenediamine, 2,2'-dimethylbenzidine and the like; aliphatic diamines such as trimethylenediamine, tetramethylenediamine, hexamethylenediamine, 2,11-dodecanediamine and the like; silicon-based diamines such as bis(p-aminophenoxy)dimethylsilane, 1,4-bis(3-aminopropyldimethylsilyl)benzene, bis(3-aminopropyl) tetramethyldisiloxane and the like; alicyclic diamines such as 1,4-diaminocyclohexane, bis(4-aminocyclohexyl)methane, isophoronediamine and the like; and guanamines such as acetoguanamine, benzoguanamine and the like.

Furthermore, examples of the diaminosiloxane include compounds represented by the formulae (1) to (9):

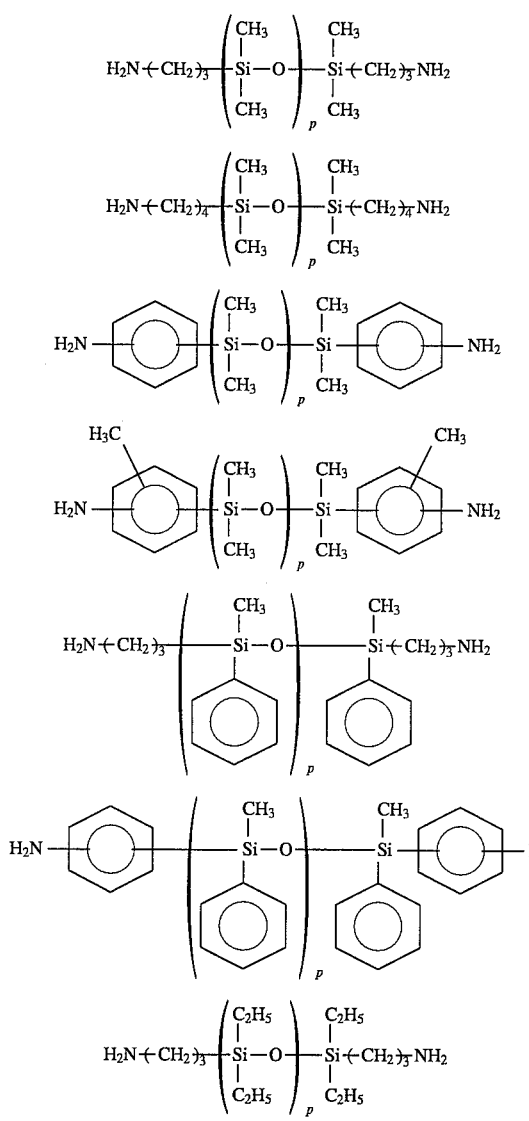

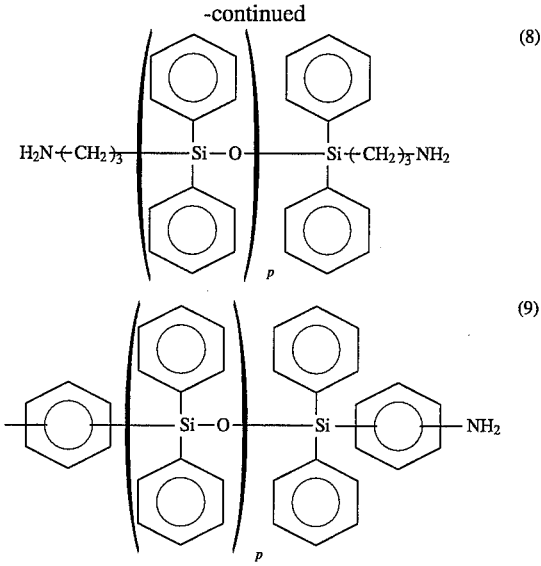

In addition to the above-mentioned compounds, known diamines can also be used.

As described above, the polyamic acid which is the polyimide precursor can be obtained by reacting the tetracarboxylic dianhydride with the diamine in the solvent, but preferable typical examples of this solvent (hereinafter referred to as "reaction solvent" on occasion) are as follows:

N-methyl-2-pyrrolidone, N,N-dimethylacetamide, N,N-dimethylformamide, dimethyl sulfoxide, tetramethylurea, pyridine, hexamethylphosphoramide, methylformamide, N-acetyl-2-pyrrolidone, 2-methoxyethanol, 2-ethoxyethanol, 2-butoxyethanol, diethylene glycol monomethyl ether, diethylene glycol monoethyl ether, diethylene glycol monobutyl ether, cyclopentanone, methylcyclopentanone, cyclohexanone, cresol, y-butyrolactone, isophorone, N,N-diethylacetamide, N,N-diethylformamide, N,N-dimethylmethoxyacetamide, tetrahydrofuran, N-methyl-ε-caprolactam and tetrahydrothiophene dioxide (sulpholane).

Furthermore, the above-mentioned organic solvent, when used, may be diluted with another non-protonic (neutral) organic solvent such as an aromatic, an alicyclic or an aliphatic hydrocarbon, or its chlorinated derivative (e.g., benzene, toluene, xylene, cyclohexane, pentane, hexane, petroleum ether or methylene chloride), or dioxane and the like.

The solution of the polyamic acid which is the polyimide precursor can be obtained from the above-mentioned acid dianhydride and the diamine in the presence of the above-mentioned solvent by a known process. This polyamic acid solution is poured into water to precipitate the polyamic acid, and the precipitated polyamic acid is dried, and then heated to obtain a polyimide. In addition to this process, the polyimide can be obtained by, for example, a method in which a dehydrating agent and a tertiary amine are added to the polyamic acid, or a method in which the polyamic acid is partially changed into an isoimide in a solvent, and the isoimide moiety is converted into an imide.

For the purpose of improving adhesive properties to the substrate, aminosilane can be introduced into the terminal of the polymer.

Typical examples of this aminosilane include the following known compounds, but the invention should not be construed as being limited to these compounds:

Aminomethyl-di-n-propoxy-methylsilane, (β-aminoethyl)-propoxy-methylsilane, (β-aminoethyl)-n-diethoxy-phenylsilane, (β-aminoethyl)-tri-n-propoxysilane, (β-aminoethyl)-dimethoxy-methylsilane, (Y-aminopropyl)-di-n-propoxy-methylsilane, (Y-aminopropyl)-di-n-butoxy-methylsilane, (y-aminopropyl)triethoxysilane, (Y-aminopropyl)-di-n-pentoxy-phenylsilane, (Y-aminopropyl)-methoxy-n-propoxy-methylsilane, (δ-aminobutyl)-dimethoxy-methylsilane, (3-aminophenyl)-di-n-propoxysilane, (4-aminophenyl)-tri-n-propoxysilane, {β-(4-aminophenyl)ethyl}-diethoxy-methylsilane, {β-(3-aminophenyl)ethyl}-di-n-propoxy-phenylsilane, {Y-(4-aminophenyl)propyl}-di-n-propoxy-methylsilane, {Y-(4-aminophenoxy)propyl}-di-n-propoxy-methylsilane, {Y-(3-aminophenoxy)propyl}-di-n-butoxy-methylsilane, {Y-(3-aminophenoxy)propyl}-dimethyl-methoxysilane, {Y-aminopropyl)-methyl-diethoxysilane, {Y-aminopropyl)-ethyl-di-n-propoxysilane, (4-aminophenyl)-trimethoxysilane, (3-aminophenyl)-trimethoxysilane, (4-aminophenyl)-methyl-dimethoxysilane, (3-aminophenyl)-dimethyl-methoxysilane, (4-aminophenyl)-triethoxysilane, {3-(triethoxysilyl)propyl}urea and the like.

In addition to these aminosilane compounds, a monovalent acid anhydride or a compound having an amino group can be added to carry out the reaction, for the purpose of controlling the molecular weight of the polyimide. Examples of such a compound include compounds such as phthalic anhydride, maleic anhydride, aniline, monoallylamine and the like.

The isocyanurate having a (meth)acrylic group which constitutes a photosensitive resin composition of the present invention is an isocyanurate containing an acrylic group, a methacrylic group, or both of the acrylic group and the methacrylic group. Furthermore, the polyalkylene glycol di(meth)acrylate is polyalkylene diacrylate, polyalkylene dimethacrylate or polyalkylene acrylate• methacrylate. These compounds are all photosensitive components.

Examples of the isocyanurate having the (meth)acrylic group include compounds represented by the following formulae 10 to 15:

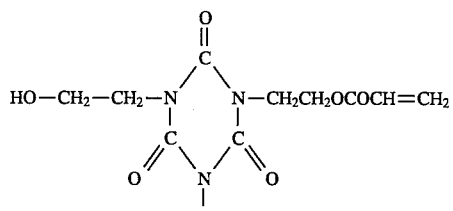  (10)

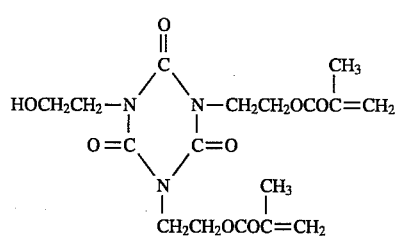  (11)

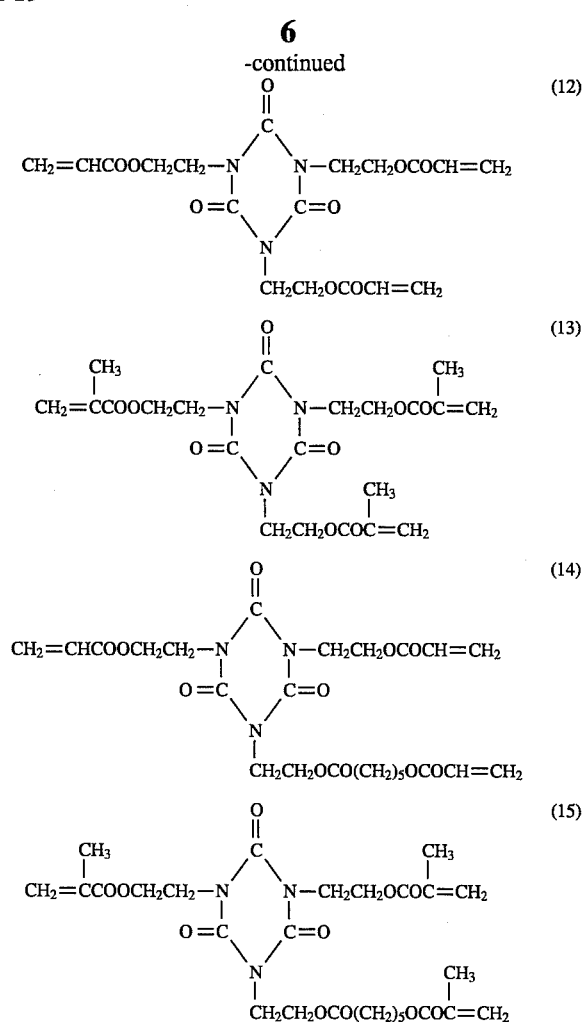

Moreover, examples of the polyalkylene glycol di(meth)acrylate include compounds represented by the following formulae 16 to 24:

  (16)

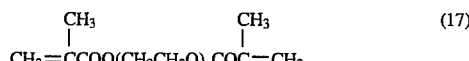  (17)

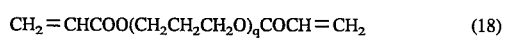  (18)

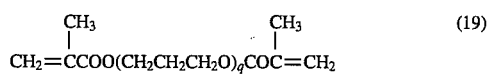  (19)

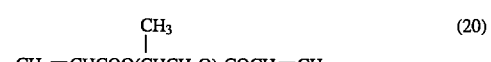  (20)

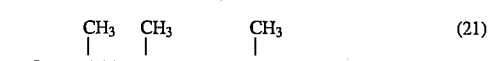  (21)

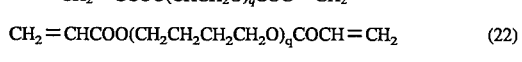  (22)

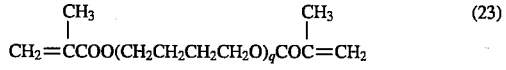  (23)

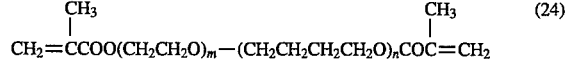  (24)

(However, in the formulae 16 to 24, $2<q<10$, $2<m+n\leq 10$, and $m\geq 1$ and $n\leq 1$.)

With regard to the amounts of the photosensitive components to be added, the amount of the isocyanurate having the (meth)acrylic group is in the range of from 10 to 100 parts by weight, preferably from 20 to 80 parts by weight, based on 100 parts by weight of the polyimide, and the amount of the polyalkylene glycol di(meth)acrylate is in the range of from 10 to 100 parts by weight, preferably from 20 to 80 parts by weight, based on 100 parts by weight of the polyimide. When the photosensitive component is only the isocyanurate having the (meth)acrylic group, surface roughness of the obtained coating film takes place, and when the photosensitive component is only the polyalkylene glycol di(meth)acrylate, the coating film becomes sticky. Thus, these cases are not preferable. Only by adding both the components in the above-mentioned ratio, the high-sensitive photosensitive resin composition can be obtained, and hence the good coating film can be obtained.

As the photopolymerization initiator or a sensitizer which can be used in the present invention, known compounds can be used singly or in the form of a mixture of two or more thereof. Typical examples of these compounds include the following compounds, but they are not limited to these compounds:

Benzophenone, Michler's ketone, 4,4'-diethylaminobenzophenone, xanthone, thioxanthone, isopropylxanthone, 2,4-diethylthioxanthone, 2-ethylanthraquinone, acetophenone, 2-hydroxy-2-methylpropiophenone, 2-hydroxy-2-methyl-4'-isopropylpropiophenone, 1-hydroxycyclohexyl phenyl ketone, isopropyl benzoin ether, isobutyl benzoin ether, 2,2-diethoxyacetophenone, 2,2-dimethoxy-2-phenylacetophenone, benzyl, camphorquinone, benzanthrone, 2-methyl-1-{4-(methylthio)phenyl}-2-morpholino-1-propane, 3,3',4,4'-tetra(t-butylperoxycarbonyl)benzophenone, N-phenyl-glycine, p-hydroxy-N-phenylglycine, tetramethylthiuram monosulfide, tetramethylthiuram disulfide, p-tolyl disulfide, ethyl 4-dimethylaminobenzoate, isoamyl 4-dimethylaminobenzoate, 3,3'-carbonyl-bis(7-diethylamino)coumarin, 2,6-bis(p-azidobenzylidene)-cyclohexanone, 2,6-bis(p-azidobenzylidene)-4-methylcyclohexanone, 2,6-bis(p-azidobenzylidene)-4-t-butylcyclo-hexanone and the like.

The amount of the photopolymerization initiator is in the range of from 0.05 to 20% by weight, preferably from 0.5 to 10% by weight based on the weight of the polyimide.

Furthermore, if necessary, a known compound having a carbon-carbon double bond or a polyhydric thiol can be added as a crosslinking auxiliary in an amount of 50% by weight or less based on the weight of the polyimide. Typical examples of the crosslinking auxiliary are as follows:

Butyl acrylate, cyclohexyl acrylate, dimethylaminoethyl methacrylate, benzyl acrylate, Carbitol acrylate, 2-ethylhexyl acrylate, 2-ethylhexyl methacrylate, lauryl methacrylate, 2-hydroxyethyl acrylate, 2-hydroxyethyl methacrylate, 2-hydroxypropyl acrylate, 2-hydroxypropyl methacrylate, glycidyl methacrylate, N-methylolacrylamide, N-diacetoneacrylamide, N,N'-methylenebisacrylamide, N-vinylpyrrolidone, ethylene glycol diacrylate, diethylene glycol diacrylate, triethylene glycol diacrylate, butylene glycol diacrylate, butylene glycol dimethacrylate, neopentyl glycol diacrylate, neopentyl glycol dimethacrylate, 1,4-butanediol diacrylate, 1,6-hexanediol diacrylate, 1,6-hexanediol dimethacrylate, pentaerythritol diacrylate, pentaerythritol triacrylate, trimethylolpropane triacrylate, trimethylolpropane trimethacrylate, pentaerythritol tetra(3-mercaptopropionate), pentaerythritol (mercaptoacetate) and the like.

In addition thereto, a thermal polymerization inhibitor such as hydroquinone, p-methoxyphenol and the like, or a supplementary material such as a dye, a pigment and the like can also be added.

Next, reference will be made to a method for forming a patterned polyimide film by the use of the photosensitive resin composition of the present invention. The photosensitive resin composition of the present invention is applied onto a substrate such as a silicon wafer, a metal plate, a plastic plate or a glass plate and the like by a known technique such as spin coating, immersion or spray printing and the like. The thus formed film is prebaked at a temperature of 30°–150° C. by the use of a heating means such as an electric furnace or a hot plate to remove most of the solvent from the film. A negatived mask is put on this film, and it is then irradiated with chemical rays. Examples of the chemical rays include X-rays, electron beams, ultraviolet rays or visible light and the like, but ultraviolet rays and far infrared rays are particularly suitable. Next, a relief pattern is formed by dissolving/removing unexposed portions of the film with a developing agent. If necessary, the film can be rinsed in a non-solvent, and then dried at a temperature of 150° C. or less to stabilize the relief pattern. The thus treated film can be peeled from the substrate at any time after the prebaking step, and then used as a single film. The polymer on which the relief pattern is formed by the development is heated at a temperature of 200°–500° C., preferably 300°–400° C. by the above-mentioned heating means to form a patterned polyimide film. In this case, the isocyanurate having the (meth)acrylic group and the polyalkylene glycol di(meth)acrylate which are compounds containing a photosensitive group polymerize by the chemical rays to form a polymer, but this polymer thermally decomposes by post baking and then volatilizes from the film. Thus, the patterned polyimide film having heat resistance can be obtained from the photosensitive resin composition of the present invention.

BEST MODE FOR CARRYING OUT THE INVENTION

Now, the present invention will be described in detail in reference to examples, but the scope of the present invention should not be limited to these examples.

In synthesis examples and examples, each rotation viscosity is a value measured at a temperature of 25±0.1° C. by the use of an E type viscometer (trademark Visconic EMD, made by Tokyo Keiki Co., Ltd.).

Synthesis Example 1 of Polyimide

A 500 milliliter flask equipped with a stirrer, a dropping funnel, a thermometer, a condenser and a nitrogen replacing device was fixed in a thermostatic chamber.

300.0 g of dehydrated and purified N,N-dimethylacetamide (hereinafter abbreviated to "DMAc") and 53.9 g (0.104 mol) of 2,2-bis[4-(4-aminophenoxy)phenyl]hexafluoropropane (hereinafter abbreviated to "HFBAPP") were poured into the flask, and stirring was continued to dissolve them. Afterward, 46.1 g (0.104 mol) of hexafluoroisopropylidene-2,2-bis(phthalic anhydride) (hereinafter abbreviated to "6FDA") were added to this solution, and reaction was then carried out at 20°–30° C. for 8 hours to obtain a polyamic acid.

This polyamic acid solution was poured into 5 liters of water to precipitate the polyamic acid. Next, this polyamic acid was heated in an oven at 60° C. for 3 hours to dry the same, and it was further heated in the oven at 180° C. for 1 hour to carry out imidation, thereby obtaining 80.0 g of a polyimide.

Next, a 300 milliliter flask equipped with a stirrer, a thermometer, a condenser and a nitrogen replacing device was fixed in a thermostatic chamber, and 50.0 g of the above-mentioned polyimide and 150.0 g of γ-butyrolactone were poured into the flask. The solution was then stirred to dissolve them, whereby a solution containing 25% by weight of a polyimide was obtained. The rotation viscosity of this solution was 10000 cps.

Synthesis Examples 2 to 5 of Polyimide

The same procedure as in Synthesis Example 1 was carried out except that 53.9 g of HFBAPP and 46.1 g of 6FDA were replaced with 35.9 g of 4,4'-diaminodiphenyl sulfone (hereinafter abbreviated to "DPS") and 64.1 g of 6FDA (Synthesis Example 2); 31.1 g of 4,4'-diamino diphenyl ether (hereinafter abbreviated to "DDE") and 38.9 g of 6FDA (Synthesis Example 3); 49.3 g of 4,4'- di(p-aminophenoxy) diphenyl sulfone (hereinafter abbreviated to "BAPS") and 50.7 g of 3,3',4,4'-benzophenonetetracarboxylic dianhydride (hereinafter abbreviated to "BTDA") (Synthesis Example 4); and 49.7 g of BAPS, 3.8 g of bis(3-aminopropyl)tetramethyldisiloxane (hereinafter abbreviated to "APDS"), 46.5 g of diphenylsulfone-3,3'4,4'-tetracarboxylic dianhydride (hereinafter abbreviated to "DSDA") (Synthesis Example 5), to synthesize polyimides, and solutions containing 25% by weight of the polyimides were then obtained in the same manner as in Example 1. The results are set forth together with those of Synthesis Example 1 in Table 1.

TABLE 1

| Polyimide* | Reactants | | | | Rotation |
|---|---|---|---|---|---|
| Synthesis Example | Acid Anhydride Abbrev. g (mol) | | Diamine Abbrev. g (mol) | | Viscosity cps |
| 1 | 6FDA | 46.1 (0.104) | HFBAPP | 53.9 (0.104) | 10,000 |
| 2 | 6FDA | 64.1 (0.144) | DPS | 35.9 (0.144) | 8,800 |
| 3 | 6FDA | 38.9 (0.155) | DDE | 31.1 (0.155) | 11,500 |
| 4 | BTDA | 50.7 (0.114) | BAPS | 49.3 (0.114) | 9,900 |
| 5 | DSDA | 46.5 (0.130) | BAPS | 49.7 (0.115) | 11,000 |
| | | | APDS | 3.8 (0.015) | |

*A 25 wt % γ-butyrolactone solution.

EXAMPLE 1

A 300 milliliter flask equipped with a stirrer, a thermometer, a condenser and a nitrogen replacing device was fixed in a thermostatic chamber.

100 g of the polyimide solution synthesized in Synthesis Example 1, 9.4 g of a compound represented by the formula 12 and 9.4 g of a compound represented by the formula 16 as photosensitive components were poured into the flask, and the mixture was then stirred at 20°–30° C. to dissolve them. Next, 0.5 g of 2,2-dimethoxy-2-phenylacetophenone as a photopolymerization initiator, 0.25 g of 3,3',4,4'-tetra(t-butylperoxycarbonyl)benzophenone and 0.25 g of Michler's ketone were added thereto, and stirring was continued to dissolve them, thereby preparing a composition of the present invention. The rotation viscosity of this composition was 7000 cps.

A silicon wafer was spin-coated with this composition for 30 seconds by 2000 rpm, and the composition was then prebaked for 3 minutes by a hot plate at 105° C. to form a uniform film. At this time, the thickness of the film was 21 μm. Next, exposure was carried out for various irradiation times through a mask by an ultra-high pressure mercury arc lamp (20 mW/cm$_2$). This film was immersed for 3 minutes in a developing solution comprising 60 parts by weight of DMAc and 40 parts by weight of isopropyl alcohol to carry out development, and it was rinsed with water, and then dried. The thickness of the developed film was 20 μm, and a sharp relief pattern was obtained. In this connection, a luminous exposure necessary for the resolution of its hole pattern (50 μm) was determined as sensitivity, and the thus determined value is shown on the upper side in the item of Example 1 in Table 2. The thus obtained film was baked at 150° C. for 60 minutes and additionally at 400° C. for 60 minutes in an electric furnace. At this timer the pattern was not broken. The final thickness of the film was 10 μm.

In order to inspect the stability of the composition with time, there were measured the rotation viscosity and the sensitivity of the composition which had been just prepared and the composition which had been allowed to stand at room temperature for one month. The results are set forth on the lower side in the item of Example 1 in Table 2.

EXAMPLES 2 TO 5

The same procedure as in Example 1 was carried out except that a polyimide and a photosensitive component were changed, to prepare and evaluate photosensitive resin compositions. The results are shown together with those of other examples in Table 2.

EXAMPLES 6

In 100 g of a polyimide solution synthesized in Synthesis Example 1 were dissolved 6.3 g of a compound represented by the formula 12 and 6.3 g of a compound represented by the formula 16 which were the same photosensitive components as used in Example 1, and to the resultant solution were added 1.25 g of 2,2-dimethoxy-2-phenylacetophenone, 0.625 g of 3,3',4,4'-tetra (t-butylperoxycarbonyl)benzophenone and 0.625 g of Michler's ketone which were photopolymerization initiators, to prepare and evaluate photosensitive resin compositions. The results are shown in Table 2.

EXAMPLE 7

In 100 g of a polyimide solution synthesized in Synthesis Example 1 were dissolved 17.5 g of a compound represented by the formula 12 and 17.5 g of a compound represented by the formula 16 which were the same photosensitive components as used in Example 1, and to the resultant solution were added 0.25 g of 2,2-dimethoxy-2-phenylacetophenone, 0.125 g of 3,3',4,4'-tetra (t-butylperoxycarbonyl)benzophenone and 0.125 g of Michler's ketone which were photopolymerization initiators, to prepare and evaluate a photosensitive resin composition. The results are shown in Table 2.

Comparative Examples 1 and 2

The same devices and procedure as in Example 1 were used except that 9.4 g of a compound represented by the formula 12 and 9.4 g of a compound represented by the formula 16 were replaced with 18.9 g of a compound represented by the formula 12 (Comparative Example 1) or 18.8 g of a compound represented by the formula 16 (Comparative Example 2), to prepare photosensitive resin compositions. As shown in Table 2, the thus obtained resins had low sensitivities, and the surface roughness of the film took place at the time of development. In addition, these resins had the drawback that they became sticky after prebaking.

TABLE 2

| | 25% Polyimide Solution | Photosensitive Components | | Initiator | Physical Properties of Composition | | Notes |
|---|---|---|---|---|---|---|---|
| | | | | | Sensitivity mJ/cm$^2$ after Preparation | Rotation Viscosity cps after Preparation | |
| | (1) g | (2) g | (3) g | (4) g | (after 1 month) | (after 1 month) | |
| Example 1 | Synthesis Example 1 100 | Formula 12 9.4 | Formula 16 9.4 | 1.0 | 100 (100) | 7000 (6800) | |
| Example 2 | Synthesis Example 2 100 | Formula 12 9.4 | Formula 16 9.4 | 1.0 | 100 (100) | 6000 (5600) | |
| Example 3 | Synthesis Example 3 100 | Formula 10 9.4 | Formula 16 9.4 | 1.0 | 200 (200) | 9600 (9600) | |
| Example 4 | Synthesis Example 4 100 | Formula 13 9.4 | Formula 16 9.4 | 1.0 | 150 (150) | 6800 (6900) | |
| Example 5 | Synthesis Example 5 100 | Formula 12 9.4 | Formula 17 9.4 | 1.0 | 200 (200) | 8000 (7700) | |
| Example 6 | Synthesis Example 1 100 | Formula 12 6.3 | Formula 16 6.3 | 2.5 | 300 (300) | 7500 (7400) | |
| Example 7 | Synthesis Example 1 100 | Formula 12 17.5 | Formula 16 17.5 | 0.5 | 150 (150) | 6000 (6100) | |
| Comp. Ex. 1 | Synthesis Example 1 100 | Formula 12 18.8 | — | 1.0 | 1500 (1500) | 8000 (7800) | *1 |
| Comp. Ex. 2 | Synthesis Example 1 100 | — | Formula 16 18.8 | 1.0 | 1500 (2000) | 6000 (4000) | *2 |

*1: The film surface became rough at development.
*2: The film became sticky after prebaking.

Possibility of Industrial Utilization

A photosensitive resin composition of the present invention can be utilized to obtain a patterned polyimide film having heat resistance.

The photosensitive resin composition of the present invention is considered to be applicable to 10 fields regarding electronic materials, but particularly, it can be preferably used in applications of passivation films and interlayer isolation films of semiconductor elements, α-ray breaking films for LSI memories, interlayer insulation films of thin layer multi-layer substrates, interlayer films of multi-layer boards of printed-wiring boards and the like.

The photosensitive resin composition of the present invention can be easily prepared, and a thick film obtained therefrom can possess a sufficient sensitivity. In addition, the composition is excellent in shelf stability, and so the fluctuation of film thickness with time and the change of sensitivity can be inhibited.

We claim:

1. A photosensitive resin composition which comprises (1) 100 parts by weight of a fluorine-containing polyimide, (2) 10–100 parts by weight of an isocyanurate having a (meth)acrylic group, (3) 10–100 parts by weight of a polyalkylene glycol di(meth)acrylate, and (4) 0.5–20 parts by weight of a photopolymerization initiator as essential components.

2. The photosensitive resin composition according to claim 1 wherein the polyimide is a compound also having a sulfone group.

3. The photosensitive resin composition according to claim 1 wherein said polyimide is derived from a polyamic acid formed from a tetracarboxylic dianhydride and a diamine.

4. The photosensitive resin composition according to claim 3 wherein said tetracarboxylic dianhydride and diamine are aromatic compounds.

5. The photosensitive resin composition according to claim 3 wherein said tetracarboxylic dianhydride is hexafluoroisopropylidene-2,2-bis(phthalic anhydride).

6. The photosensitive resin composition according to claim 5 wherein said diamine is 4,4'-diaminodiphenyl sulfone.

7. The photosensitive resin composition according to claim 6 wherein said isocyanurate having a (meth)acrylic group is represented by formula

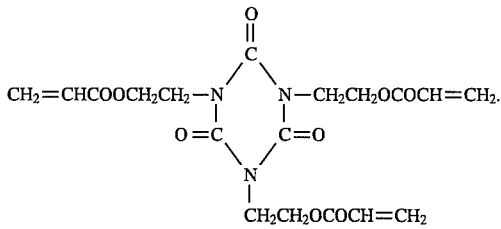

8. The photosensitive resin composition according to claim 7 wherein said polyalkylene glycol di(meth)acrylate is represented by formula

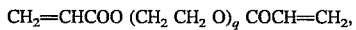

wherein $2 \leq q \leq 10$.

9. The photosensitive resin composition according to claim 9 wherein said diamine is 4,4'-diaminodiphenyl ether.

10. The photosensitive resin composition according to claim 9 wherein said isocyanurate having a (meth)acrylic group is represented by the formula

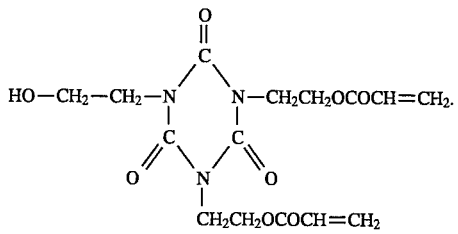

11. The photosensitive resin composition according to claim 10 wherein said polyalkylene glycol di(meth)acrylate is represented by formula

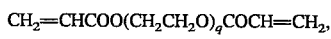

wherein $2 \leq q \leq 10$.

12. The photosensitive resin composition according to claim 3 wherein said tetracarboxylic dianhydride is diphenylsulfone-3,3',4,4'-tetracarboxylic dianhydride.

13. The photosensitive resin composition according to claim 3 wherein said diamine is 2,2-bis{4-(4-aminophenoxy)phenyl}hexafluoropropane.

14. The photosensitive resin composition according to claim 13 wherein said tetracarboxylic dianhydride is hexafluoroisopropylidene-2,2-bis(phthalic anhydride).

15. The photosensitive resin composition according to claim 14 wherein said isocyanurate having a (meth)acrylic group is represented by formula

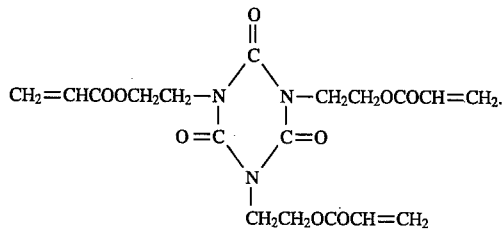

16. The photosensitive resin composition according to claim 7 wherein said polyalkylene glycol di(meth)acrylate is represented by formula

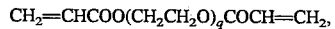

wherein $2 \leq q \leq 10$.

* * * * *

UNITED STATES PATENT AND TRADEMARK OFFICE
CERTIFICATE OF CORRECTION

PATENT NO.   :   5,589,319
DATED        :   December 31, 1996
INVENTOR(S)  :   Katou et al.

It is certified that error appears in the above-indentified patent and that said Letters Patent is hereby corrected as shown below:

Column 13, Line 3, change "9" to --5--.

Signed and Sealed this

First Day of April, 1997

Attest:

BRUCE LEHMAN

Attesting Officer

Commissioner of Patents and Trademarks